United States Patent [19]

Sakaguchi et al.

[11] Patent Number: 5,257,004
[45] Date of Patent: Oct. 26, 1993

[54] VARIABLE PASSIVE ELEMENT

[75] Inventors: Takahiro Sakaguchi, Kodaira; Michiaki Nagai, Koganei, both of Japan

[73] Assignee: TEAC Corporation, Japan

[21] Appl. No.: 901,855

[22] Filed: Jun. 22, 1992

[30] Foreign Application Priority Data

Jun. 24, 1991 [JP] Japan .................. 3-47640[U]

[51] Int. Cl.$^5$ .................................. H01C 10/40
[52] U.S. Cl. ........................... 338/188; 338/184; 338/185; 338/168
[58] Field of Search ............... 338/188, 184, 175, 167, 338/168

[56] References Cited

FOREIGN PATENT DOCUMENTS 56-104108 of 1981 Japan .
56-104110 of 1981 Japan .
58-20505 of 1983 Japan .
58-20506 of 1983 Japan .

Primary Examiner—Marvin M. Lateef
Attorney, Agent, or Firm—Andrus, Sceales, Starke & Sawall

[57] ABSTRACT

A pre-set variable passive element can prevent faulty insulation between itself and a conductive board. A cylindrical member extended higher than a adjusting member is made of ceramic around the adjusting member which is rotatably fitted for adjustment of the value of resistance of the pre-set variable resistor element, the forming of the cylindrical member being integrally formed with a main part also formed in a ceramic. The cylindrical member is fitted into an opening bored in a stator board mainly of a steel plate, and the pre-set variable resistor is fitted on the stator board. The adjusting member which is contacted by a contact, by which the value of resistance of the pre-set variable resistor element is determined, and an inside periphery of the opening free from any insulating treatment is securely insulated by the cylindrical member.

7 Claims, 5 Drawing Sheets

VARIABLE PASSIVE ELEMENT

BACKGROUND OF THE INVENTION

The present invention relates to a variable passive element and more particularly to a pre-set variable passive element having a movable part for adjustment made of a conductive material and mounted on a board made of a conductive material.

FIG. 1 is a cross sectional view of a conventional variable passive element fitted on a board, and FIG. 2 is a partially sectioned perspective view taken along the line pointed by the arrow A of FIG. 1.

In FIGS. 1 and 2, the notation numeral 1 represents a pre-set variable resistor, which is a variable passive element. This pre-set variable resistor 1 is mounted on a stator board 3, on which a spindle motor 2 of a disk drive is formed, and is used as an electronic part for adjusting the timing of index of the spindle motor 2. This pre-set variable resistor 1 which is made of an insulating material such as a ceramic and is composed of a main part 1a, on top of which a resistor (not shown in the figure) is applied, and an adjusting member 1b made of a conducting material, in which member an electric contact 1c is slid on the resistor. With the rotation of this adjusting member 1b, the position of the contact 1c on the resistor is changed and the value of resistance changes. As shown in FIGS. 1 and 2, this adjusting member 1b forms a protuberance on the surface of main part 1a so that the rotational operation can be easily performed.

Generally, in a spindle motor for a disk drive such as the spindle motor 2, the stator board 3 often serves as a yoke of the motor because a coil 2a is disposed on the stator board 3. In this case, the stator board 3 is made of a thin steel plate. Recently, in order to meet the demand for thinner and smaller disk drive, this stator board 3 made of steel plate for the purpose of serving as the yoke is often used as a circuit board for mounting electric parts for motor driving circuit. Accordingly, the production of the stator board 3 should be such that a steel plate is first processed into a specified form, an insulating paint is applied on the surface, a specified circuit pattern of copper foil is formed thereon by a method such as etching, and a masking paint is applied, after which devices to be mounted and cream solder are disposed.

Since a disk detaching/attaching mechanism (not shown in the figure) is fitted above the spindle motor 2 in this disk drive, the adjusting of the adjusting member 1b of the pre-set variable resistor 1 is performed from underneath of the stator board 3. Therefore, when mounting the pre-set variable resistor on the stator board 3, an opening 3a is bored in the stator board 3 as shown in FIGS. 1 and 2, through which opening 3a the adjusting of the adjusting member 1b is performed from the underside 3b of the stator board 3.

In the conventional technology described above, when the position at which the pre-set variable resistor is fitted is displaced in a direction parallel with the surface of the stator board 3, the adjusting member 1b protruding from the main part 1a and an inside periphery of the opening 3a of the stator board 3 come into contact.

Since the adjusting member 1b of the pre-set variable resistor 1 has a contact by which the adjusting of the value of resistance is performed and is formed in a conductive material, the opening 3a of the stator board 3 being bored after the surface of the steel plate is treated with an insulating paint, for example, the inside periphery of the opening 3a is not treated with an insulating material. Consequently, the conventional technology has a disadvantage in that a malfunction in a motor driving circuit is caused as a result of the adjusting member 1b and the inside periphery of the opening 3a coming into contact to cause a flow of unnecessary electric current.

An idea has been brought forth that the inside periphery of the opening 3a be treated with an insulating material but the forming of a insulating film on the cross section of the thin stator board 3 is not only difficult but accompanied by an unfavorable effect of raising a cost because of the insulation treatment.

SUMMARY OF THE INVENTION

It is a general object of the present invention to provide a novel and useful pre-set variable passive element for use in surface mount, which element is capable of eliminating the disadvantages mentioned above.

A more specific object of the present invention is to provide a pre-set variable passive element structure that is free from faulty insulation when mounted on a conductive board.

In order to achieve the above objects, the pre-set variable passive element of the present invention comprises:

a main part which is fitted on a mounting face on a board, which board is made of a conductive material and provided with an opening for insertion of an adjusting tool, and is made of an insulating material having an opposing face opposite to the mounting face on the board; and a conductive adjusting member by which an adjusting operation is performed from the side opposite to the mounting face through the opening; and is configured such that the main part has a protuberance that is provided surrounding the adjusting member that protrudes from the opposing face of the main part, which protuberance fits into the opening, the protuberance being interposed between the adjusting member protruding from the opposing face and a inside periphery of the opening of the board.

The pre-set variable passive element of the present invention can also comprise:

a main part which is fitted on a mounting face of a board, the board comprising a conductive material and having an opening for insertion of an adjusting tool, the main part comprising an insulating material and having an opposing face opposite to the mounting face of the board; and a conductive adjusting member by which an adjusting operation is performed from the side opposite to the mounting face through the opening, the main part having a protuberance that is provided surrounding the adjusting member that protrudes from the opposing face of the main part, the protuberance fitting into the opening, and being interposed between the adjusting member and an inside periphery of the opening of said board.

In accordance with the present invention, the separation between the adjusting member of the variable passive element and the inside periphery of the opening of the board is ensured so that a complete insulation is achieved, thereby preventing an electric malfunction that is otherwise caused by faulty insulation between the adjusting member of the variable passive element and the board. Thus the yield of the board on which to fit the pre-set variable passive element of the present invention is improved. The present invention also has an advantage in that it is possible to give an entire passive element main part a simple form and to make the process of manufacturing a passive element efficient.

Further objects, characteristics, and advantages of the present invention will become apparent from the following detailed description when read in conjunction with the attached drawings.

DESCRIPTION OF THE PREFERRED EMBODIMENTS

Figure 1:
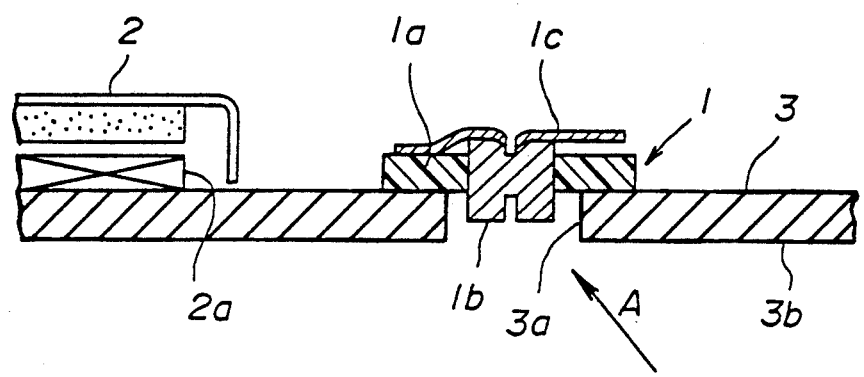
FIG. 1 is a cross sectional view illustrating a conventional variable passive element fitted on a board.
Figure 2:
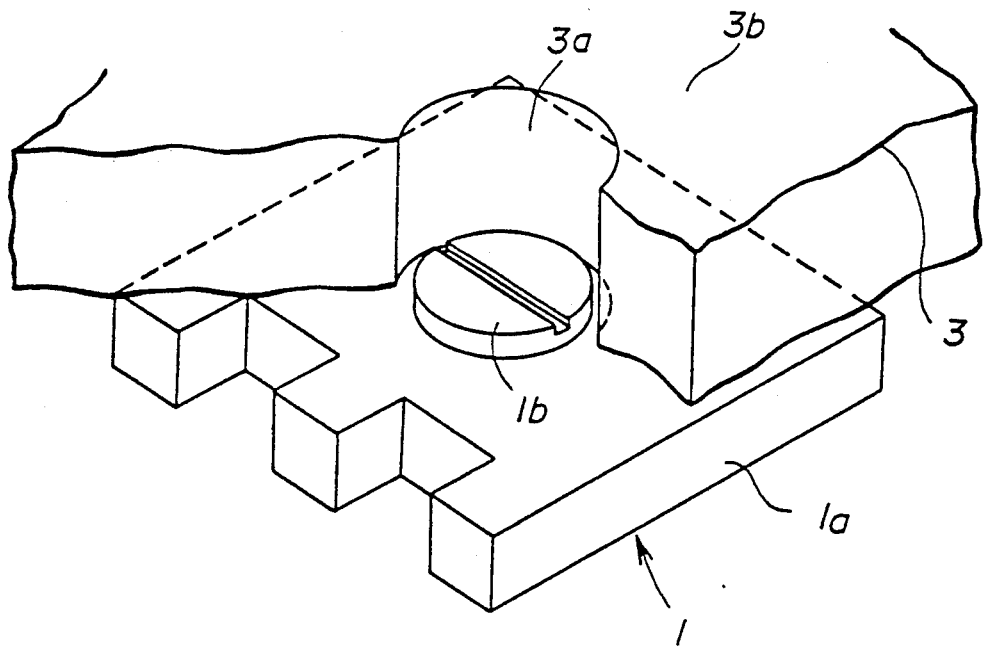
FIG. 2 is a partially sectioned perspective view taken along the line pointed by the arrow A of FIG. 1.
Figure 3:
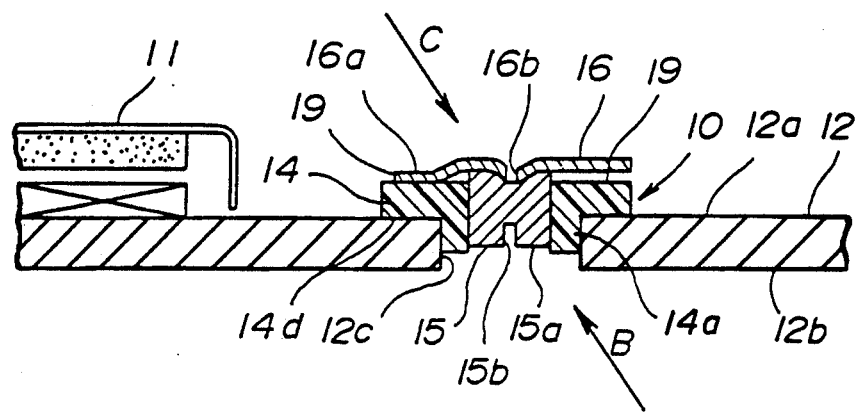
FIG. 3 is a cross sectional view illustrating a first embodiment of a variable passive element of the present invention fitted on a board.
Figure 4:
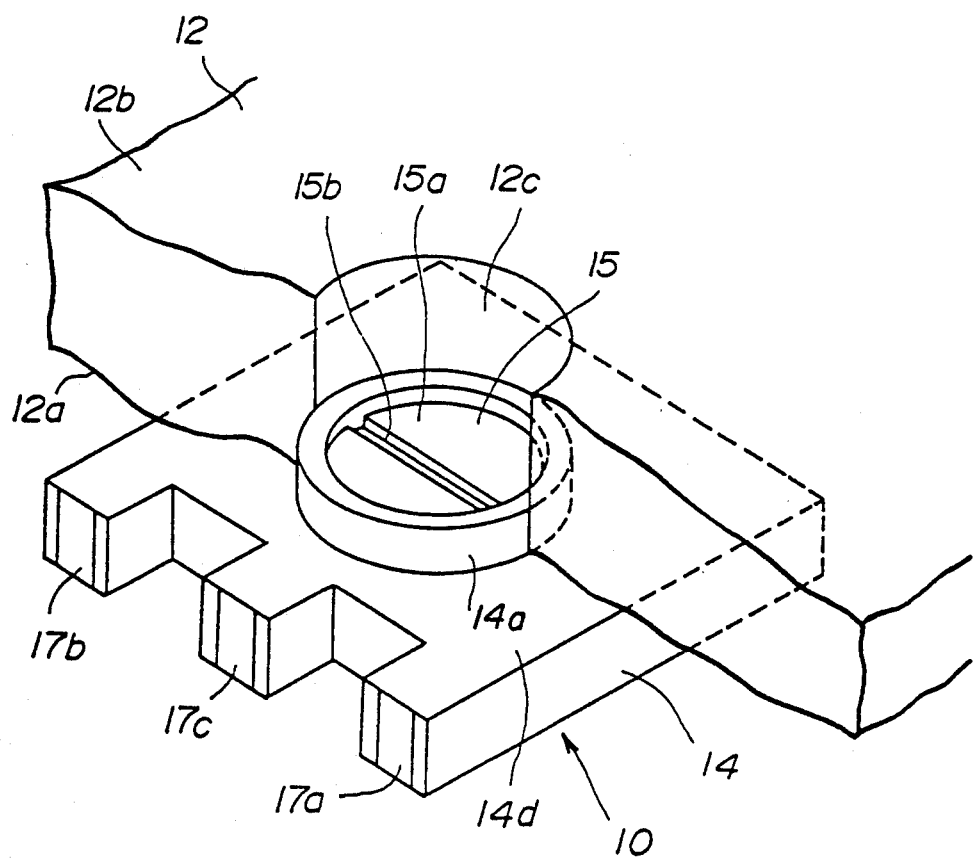
FIG. 4 is a partially sectioned perspective view taken along the line pointed by the arrow B of FIG. 3.
Figure 5:
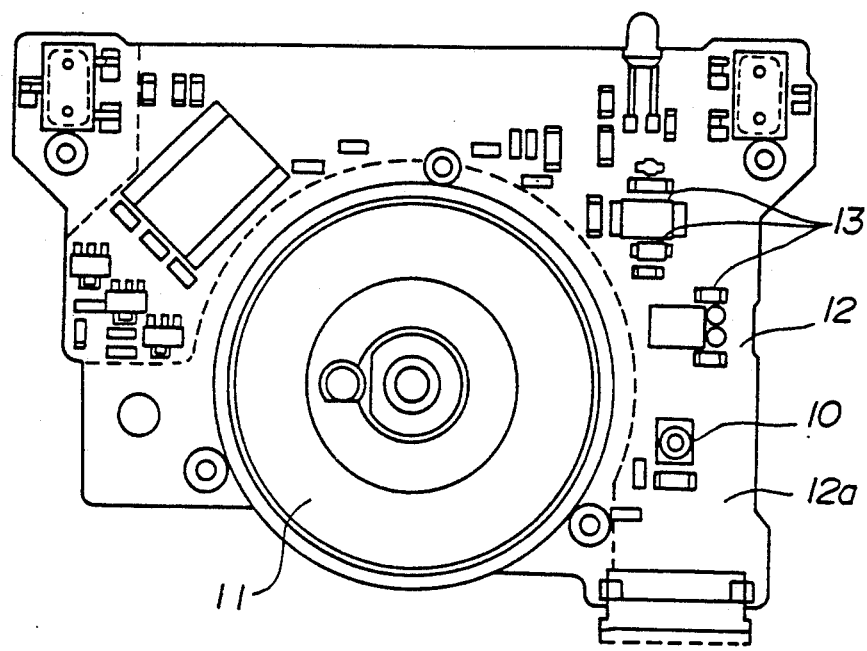
FIG. 5 is a top view illustrating a board on which the variable passive element shown in FIG. 3 is fitted.
Figure 6:
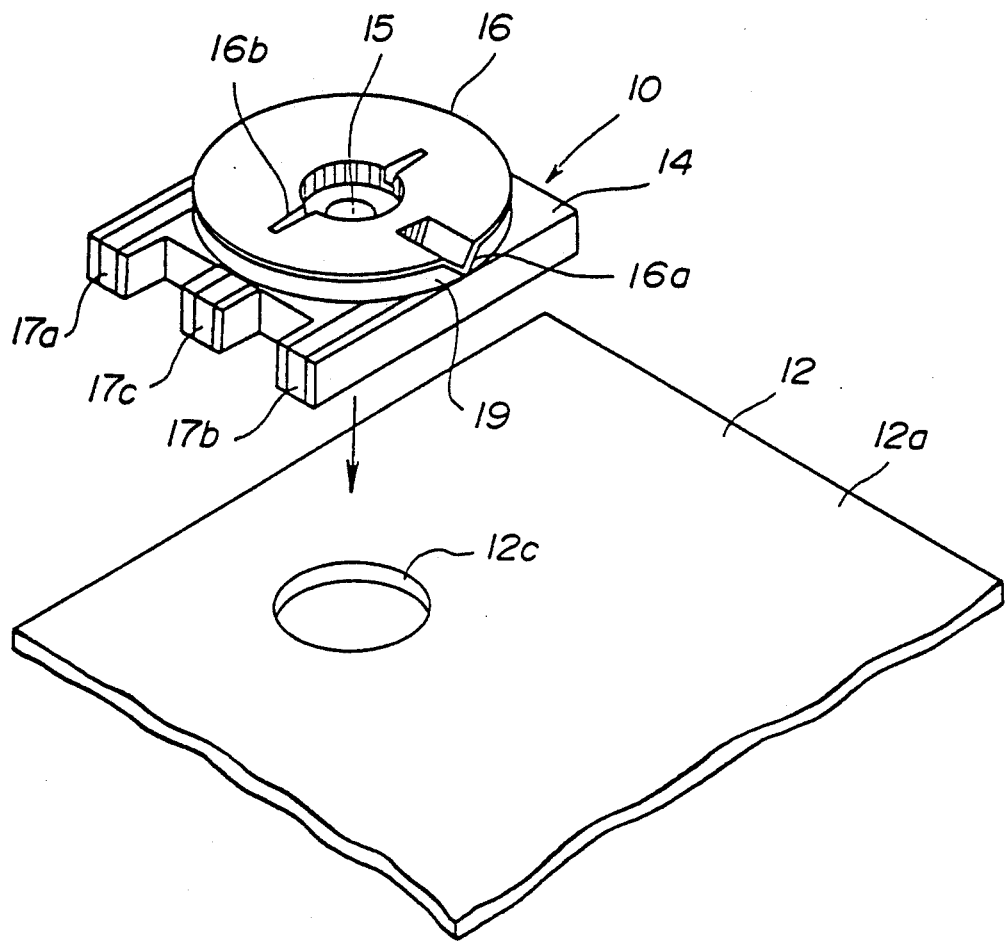
FIG. 6 is a fragmentary perspective view taken along the line pointed by the arrow C of FIG. 3.

FIG. 3 illustrates a cross sectional view of a first embodiment of the variable passive element of the present invention fitted on a board, and FIG. 4 is a partially sectioned perspective view taken along the line pointed by arrow B of FIG. 3, FIG. 5 is a top view of a board on which the variable passive element of shown in FIG. I is fitted, and FIG. 6 is a fragmentary perspective view taken along the line pointed by the arrow C of FIG. 1.

Referring to the above figures, the reference numeral 10 represents a variable passive element of the present invention in the form of a pre-set variable resistor. This pre-set variable resistor 10 is mounted on a topside 12a of a stator board 12 on which board a spindle motor 11 of a disk drive is formed, together with other electronic parts such as 13, as components of a motor driving circuit. This pre-set variable resistor 10 is used for adjusting a resistance value of an electric circuit provided for adjusting the timing of an index of the spindle motor 11.

This pre-set variable resistor 10 has a main part 14 made of a ceramic, an insulating material, as shown in FIGS. 3 and 4. On the topside of the main part 14 an annular resistor having two ends is provided in the form of a carbon coat 19. A conductive adjusting member 15 is rotatably inserted into an opening provided at the center of the main part 14. On the top end of the adjusting member 15, a disk-like slider 16 having a contact 16a which is in sliding contact with the carbon coat 19 is crimped into engagement. The lateral sides of the main part 14 are provided with terminals 17a and 17b connected to the ends of the carbon coat 19 and a 16 via the adjusting member 15.

At a bottom end 15a of the columnar adjusting member 15 made of a conductive material, a slot 15b for insertion of a screw driver is formed, and also a slot 16b for insertion of a screw driver is formed at the center of the slider 16 secured on the top end of the adjusting member 15. Therefore, the adjusting member 15 is rotatable from either side of the pre-set variable resistor 10, from above or from below. The rotation of the adjusting member 15 allows the contact 16a on the slider 16 to slide on the carbon coat 19 formed on the main part 14. Since the carbon coat 19 is a resistor, the position of the contact 16a on the carbon coat 19 determines the value of resistance between the end of the carbon coat 19 and the contact 16a. Thus, in the pre-set variable resistor 10, the resistance between the terminals 17c and 17a, and also between the terminals 17c and 17b can be varied by rotating the adjusting member 15.

The stator board 12 is of the same configuration as the conventional stator board 3, and the stator board serves also as the board for the motor driving circuit for the purpose of minimizing the thickness of a disk drive, and is formed such that insulating paint and a circuit pattern, for example, are disposed on a steel plate. As described above in accordance with the conventional technology, an attaching/detaching mechanism (not shown in the figure) is provided further above the topside 12a on which various electronic parts are mounted. Therefore, in a manner similar to the conventional technology, the portion of the stator 12 on which the pre-set variable resistor 10 is fitted is provided with an opening 12c bored for allowing the rotation of an adjusting member 15 by a screw driver inserted from an underside 12b of the stator board 12.

The pre-set variable resistor 10 has a cylindrical member 14a protruding further than the bottom end 15a of the adjusting member 15 in such a way that it surrounds the adjusting member 15 protuberance rising from a contact face 14d of the main part 14 in contact with the stator board 12. This cylindrical member 14a is integrally formed with the ceramic main part 14.

As shown in FIG. 6, when mounting the pre-set variable resistor 10 on the topside 12a of the stator board 12, the cylindrical member 14a is inserted through the opening 12c so that the contact face 14d of the main part 14 and the topside 12a of the stator board 12 are brought into contact. The opening 12c is formed with an inside diameter large enough for the cylindrical member 14a to fit therein. The pre-set variable resistor 10 is secured onto the stator board 12 by soldering the terminals 17a, 17b, and 17c to circuit patterns on the stator board 12 and soldering a support conductor (not shown in the figure) provided on the main part to a pattern not related to the circuit, respectively.

As shown in FIGS. 3 and 4, when the pre-set variable resistor 10 is secured onto the stator 12, a direct contact between the adjusting member 15 and the inside periphery of the opening 12c is prevented because the cylindrical member 14a is interposed between the inside periphery of the opening 12c and the adjusting member 15. Thus, thanks to the cylindrical member 14a made of a ceramic, an insulating material, a complete insulation takes place between the inside periphery of the opening 12c free from any insulating coat because of an exposed steel surface, and the adjusting member 15 made of a conductive material and electrically connected with the contact 16a. With an employment of the pre-set variable resistor 10 of this embodiment, a malfunction due to faulty insulation between the adjusting member 15 and the stator board 12, which malfunction occurred in the conventional technology, is completely prevented, and the yield of the stator board 12 is improved compared with the that of the conventional ones.

The pre-set variable resistor 10 can be positioned on the stator board 12 by merely fitting the cylindrical member 14a in the opening 12c while preventing, as described above, faulty insulation at the same time. According to the pre-set variable resistor 10 of this embodiment, an improved efficiency of the mounting operation for mounting the pre-set variable resistor 10 on the stator board 12 is ensured.

The production cost of the pre-set variable resistor 10 remains unchanged from the conventional technology because the cylindrical member 14a of the pre-set variable resistor 10 is integrally formed with the main part 14 as shown above, not requiring any special production process for providing the cylindrical member 14a.

As described above, by employing the pre-set variable resistor 10, faulty insulation is prevented, the yield of the stator board 12 of a disk drive is improved compared with the conventional technology, efficiency of the mounting operation of the pre-set variable resistor 10 is improved, and the production cost of the stator board 12 is kept unchanged.

While a configuration was described above in which the cylindrical member 14a is formed around the entirety of the adjusting member 15, the same effect as above can be achieved with a configuration in which blocks are provided encircling the adjusting member 15 and disposed, as a plurality of projections on the main part 14, between the adjusting member 15 and the inside periphery of the opening 12c. The same effect can be achieved even if the cylindrical member 14a is shorter in protuberance than the bottom end 15a of the adjusting member 15, as long as it has a height large enough to fit in the opening 12c. Moreover, the same effect can also be achieved with a configuration in which a gap is formed in the radial direction of the adjusting member 15 between the adjusting member 15 and the cylindrical member 14a or between the cylindrical member 14a and the inside periphery of the opening 12c.

Figure 7:
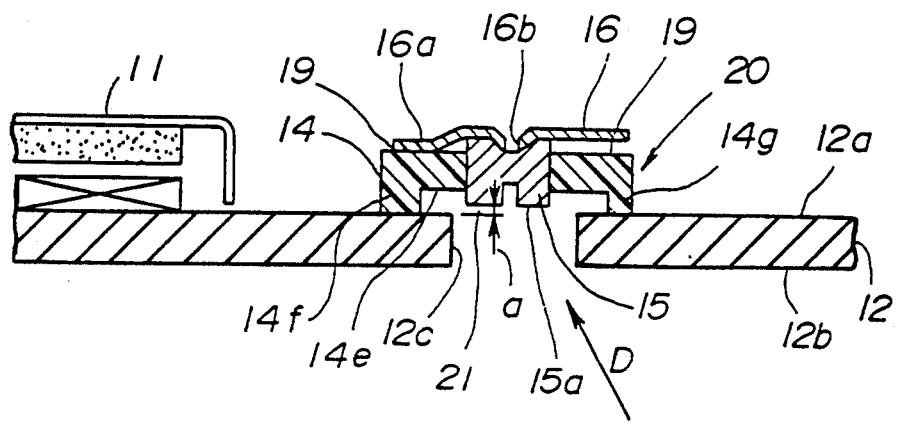
FIG. 7 is a cross sectional view illustrating a second embodiment of the variable passive element of the present invention fitted on a board.
Figure 8:
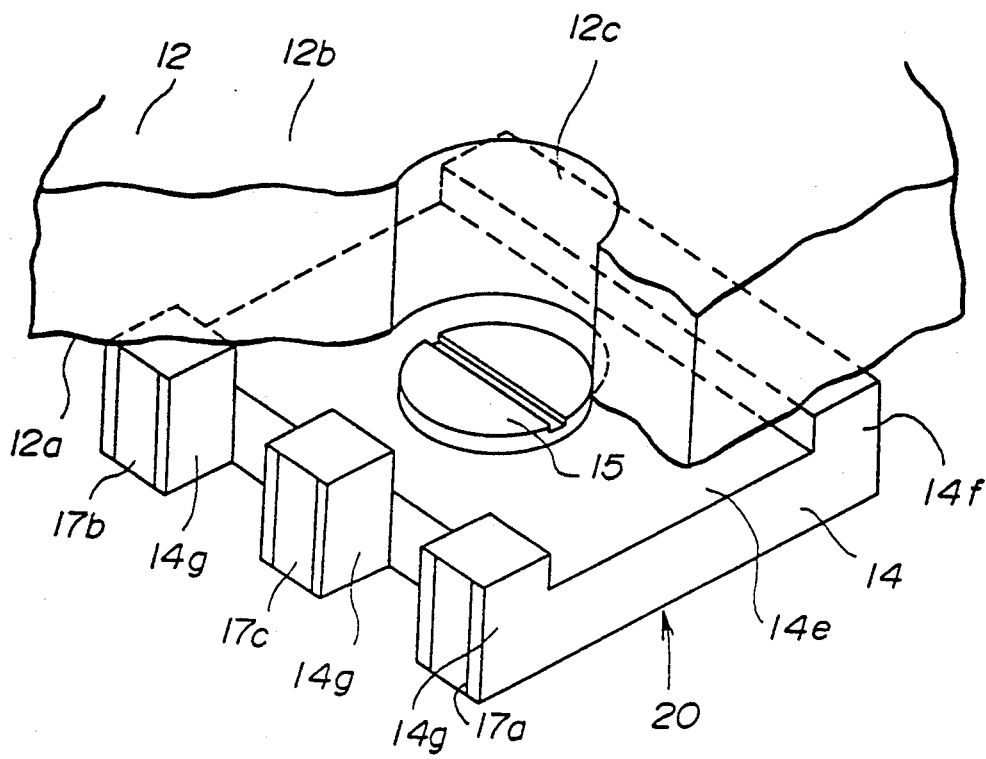
FIG. 8 is a partially sectioned perspective view taken along the line pointed by the arrow D of FIG. 7.

A description of a second embodiment of the present invention is given with FIGS. 7 and 8. FIG. 7 is a cross sectional view illustrating a second embodiment of the variable passive element of the present invention mounted on a board, and FIG. 8 is a partially sectioned perspective view taken along the line pointed by arrow D of FIG. 7. In FIGS. 5 and 6, composing parts that correspond to those of FIGS. 3 and 4 are given the same reference notations, and the description thereof are omitted.

Referring to FIGS. 7 and 8, the numeral 20 represents a pre-set variable resistor, which is a pre-set variable passive element of a second embodiment of the present invention. The pre-set variable resistor 20 has an opposing face 14e corresponding to the contact face 14d of the first embodiment above, and a spacer 14f provided on the opposing face 14e. The terminals 17a, 17b, and 17c are provided in a protuberance 14g. The cylindrical member 18 of the first embodiment is not provided in this embodiment.

In the pre-set variable resistor 20 of this embodiment, the spacer 14f is provided in such a way that it protrudes from the opposing face 14e at one end, and the protuberance 14g, on which the terminals 17a, 17b, and 17c are provided, is provided in such a way that it protrudes from the opposing face 14e at the other end. The dimensions of protuberance of the spacer 14f and the protuberance 14g from the opposing face 14e are the same.

As a result, when the pre-set variable resistor 20 is fitted on the stator board 12 in such a way that the opposing face 14e is opposite to the topside 12a of the stator board 12, a gap 21 with a dimension of a shown in the figure is formed between the underside 15a of the adjusting member 15 and the topside 12a of the stator board 12, as shown in FIG. 7. That is, the dimensions of protuberance of the spacer 14f and the protuberance 14g are set such that the gap 21 of the dimension a is formed in the state the pre-set variable resistor 20 is mounted.

With the pre-set variable resistor 20 of the second embodiment, the adjusting member 15 and the stator board 12 is separated by the gap 21 formed by the spacer 14f and the protuberance 14g, thereby preventing the contact between the adjusting member 15 and the opening 12c. Because the adjusting member 15 is completely insulated relative to the opening 12c of the stator board 12, any malfunction resulting from faulty insulation between adjusting member 15 and the stator board 12 is totally prevented. Since the spacer 14f and the protuberance 14g are made of a ceramic en bloc with the main part 14, no cost increase is brought about in the production of the pre-set variable resistor 20 of the above configuration, as is the case of the first embodiment above.

Figure 9:
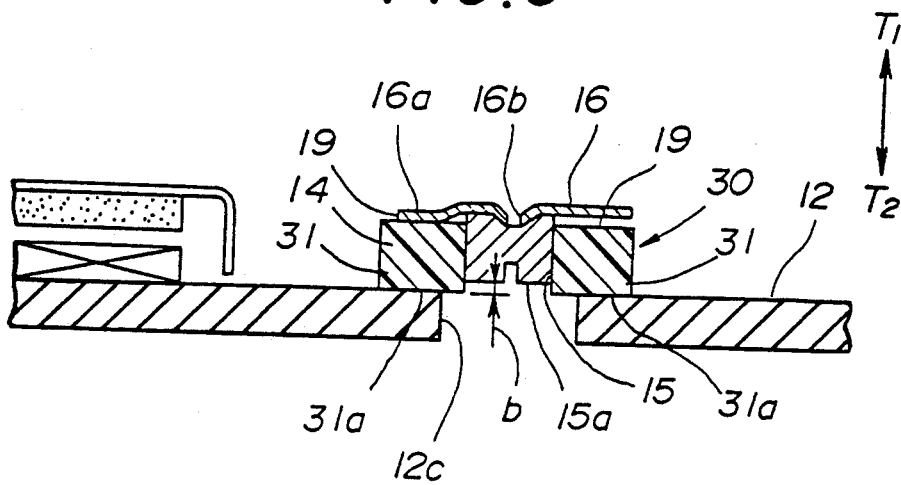
FIG. 9 is a cross sectional view illustrating a third embodiment of the passive element of the present invention fitted on a board.

While, in the second embodiment above, the spacer 14f and the protuberance 14g are formed such that they protrude from the opposing face 14e, another configuration, shown as a third embodiment in FIG. 9, is possible in which the thickness (in the direction of $T_1$-$T_2$ in the figure) of a main part 31 of a pre-set variable resistor 30 is larger than in the conventional technology so that a underside 15a of the adjusting member 15 is depressed from a contact face 31a on the main part 31, which face is contacted by the stator board 12, by a dimension b shown in the figure. This configuration also achieves the same effect as the pre-set variable resistor 20 of the second embodiment because the pre-set variable resistor 30 is mounted, with the adjusting member 15 and the stator board 12 being separated. With the pre-set variable resistor 30 of the third embodiment, the shape of the main part 31 is simpler than that of the pre-set variable resistor 20, wear of the protuberance 14g, for example, which wear could be one consequence of the pre-set variable resistor 20, is prevented, and the yield of the pre-set variable resistor 30 is improved.

While all the above embodiments are an embodiment of a pre-set variable resistor, the present invention can also be applied to a variable passive element accepting an external adjustment such as a trimmer capacitor.

The present invention is not limited to the above embodiments, and variations and modifications may be made without departing from the scope of the present invention.

What is claimed is:

1. A variable passive element suitable for mounting on a board of conductive material having an opening for insertion of an adjusting tool, said element comprising:
   a main part fitting on a mounting face of said board proximate to the opening, said main part being formed of an insulating material and having a face opposing the mounting face of said board; and a conductive adjusting member by which an adjusting operation is performed from the direction of said opposing face through said opening, said main part having a protuberance surrounding said adjusting member that protrudes from said opposing face of said main part, said protuberance fitting into said opening, and being interposed between said adjusting member and an inside periphery of said opening of said board.

2. A variable passive element as claimed in claim 1, wherein said protuberance is integrally formed with said main part.

3. A variable passive element as claimed in claim 2, wherein said protuberance has a cylindrical shape along the periphery of said adjusting member.

4. A variable passive element as claimed in claim 3, wherein said protuberance serves as a positioning guide at the time of mounting said variable element.

5. A variable passive element as claimed in claim 1, wherein said protuberance comprises a plurality of projections.

6. A variable passive element suitable for mounting on a board of conductive material having an opening for insertion of an adjusting tool, said element comprising:

a main part fitted on a mounting face of said board proximate to the opening, said main part being formed of an insulating material and having a face opposing the mounting face of said board; and a conductive adjusting member by which an adjusting operation is performed from the direction of said opposing face through said opening, a predetermined distance being formed between an end of said adjusting member residing on a side of said main part containing said opposing face and the mounting face of said board surrounding said opening.

7. A variable passive element as claimed in claim 6, wherein the end of said adjusting member is depressed lower than said opposing face of said main part.

* * * * *